(12) United States Patent
Hua et al.

(10) Patent No.: US 7,524,351 B2
(45) Date of Patent: Apr. 28, 2009

(54) NANO-SIZED METALS AND ALLOYS, AND METHODS OF ASSEMBLING PACKAGES CONTAINING SAME

(75) Inventors: Fay Hua, San Jose, CA (US); C. Michael Garner, Pleasanton, CA (US)

(73) Assignee: Intel Corporation, Santa Clara, CA (US)

(*) Notice: Subject to any disclaimer, the term of this patent is extended or adjusted under 35 U.S.C. 154(b) by 466 days.

(21) Appl. No.: 10/957,196

(22) Filed: Sep. 30, 2004

(65) Prior Publication Data

US 2006/0068216 A1    Mar. 30, 2006

(51) Int. Cl.
  *B22F 1/02*    (2006.01)
  *B23K 35/26*    (2006.01)

(52) U.S. Cl. .............................. 75/252; 75/255; 148/24; 977/777

(58) Field of Classification Search ................. 75/255, 75/252; 977/777; 148/24
See application file for complete search history.

(56) References Cited

U.S. PATENT DOCUMENTS

| | | | |
|---|---|---|---|
| 5,086,966 A * | 2/1992 | Melton et al. ............... | 228/208 |
| 5,542,602 A * | 8/1996 | Gaynes et al. .............. | 228/175 |
| 5,573,602 A * | 11/1996 | Banerji et al. ................. | 148/24 |
| 5,770,126 A | 6/1998 | Singh et al. | |
| 5,958,590 A * | 9/1999 | Kang et al. .................. | 428/403 |
| 5,964,963 A * | 10/1999 | Turchan et al. .............. | 148/22 |
| 6,305,595 B1 | 10/2001 | Chen | |
| 6,358,611 B1 | 3/2002 | Nagasawa et al. | |
| 6,783,569 B2 * | 8/2004 | Cheon et al. .................. | 75/348 |
| 2001/0004477 A1 | 6/2001 | Fukunaga et al. | |
| 2003/0059642 A1 * | 3/2003 | Mei ........................... | 428/570 |
| 2003/0129608 A1 * | 7/2003 | Mirkin et al. ................. | 435/6 |
| 2003/0146019 A1 * | 8/2003 | Hirai ........................... | 174/257 |
| 2003/0168130 A1 | 9/2003 | Shohji | |
| 2003/0224104 A1 | 12/2003 | Fukunaga et al. | |
| 2003/0224197 A1 * | 12/2003 | Soga et al. ................... | 428/570 |
| 2004/0043533 A1 | 3/2004 | Chua et al. | |
| 2004/0115340 A1 * | 6/2004 | Griego ........................ | 427/98 |
| 2007/0001280 A1 | 1/2007 | Hua | |

FOREIGN PATENT DOCUMENTS

| | | |
|---|---|---|
| EP | 1107298 A2 | 6/2001 |
| TW | 0503486 | 9/2002 |
| WO | WO-2006/132663 A2 | 12/2006 |
| WO | WO-2006132663 A3 | 12/2006 |

OTHER PUBLICATIONS

"International Search Report for corresponding PCT Application No. PCT/US2005/035409", (Nov. 29, 2006), 3 pgs.

Buffat, P., et al., "Size Effect on the Melting Temperature of Gold Particles", *Physical Review A*, 13(6), (Jun. 1976), 2287-2298.

Dick, K., et al., "Size-Dependent Melting of Silica-Encapsulated Gold Nanoparticles", *Journal of the American Chemical Society*, 124(10), (2002), 2312-2317.

Hua, F., "Electromigration-Resistant and Compliant Wire Interconnects, Nano-Sized Solder Compositions, Systems Made Thereof, and Methods of Assembling Soldered Packages", U.S. Appl. No. 11/173,939, filed Jun. 30, 2005.

Pawlow, P., "Über die Abhängigkeit des Schmeizpunktes von der Oberflächenenergie eines festen Körpers (Zusatz.) <On the Dependency of Melting Polnt to the Surface Energy of a Solid Body>", *Zeltschrift für Physlkalische Chemie*, vol. 65, (1909), 545-548.

\* cited by examiner

*Primary Examiner*—Roy King
*Assistant Examiner*—Ngoclan T Mai
(74) *Attorney, Agent, or Firm*—John N. Greaveson

(57) ABSTRACT

A nano-sized metal particle composition includes a first metal that has a particle size of about 20 nanometer or smaller. The nano-sized metal particle can include a second metal that forms a shell about the first metal. A microelectronic package is also disclosed that uses the nano-sized metal particle composition. A method of assembling a microelectronic package is also disclosed. A computing system is also disclosed that includes the nano-sized metal particle composition.

5 Claims, 6 Drawing Sheets

NANO-SIZED METALS AND ALLOYS, AND METHODS OF ASSEMBLING PACKAGES CONTAINING SAME

TECHNICAL FIELD

Disclosed embodiments relate to nano-sized metal and alloys for use in a microelectronic device package.

BACKGROUND INFORMATION

An integrated circuit (IC) die is often fabricated into a processor for various tasks. IC operation invariably leads to heat generation and thermal expansion stresses in a die package. Higher melting-point metal and alloy interconnects, although they withstand the high operating temperatures caused by the densely packed circuitry on a die, are not able to integrate with a packaged low-K interlayer dielectric layer die, which could have issues with high density current compatibility. Additionally the higher melting-point metal alloy and interconnect can be costly to the thermal budget during fabrication.

BRIEF DESCRIPTION OF THE DRAWINGS

In order to understand the manner in which embodiments are obtained, a more particular description of various embodiments will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which.

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
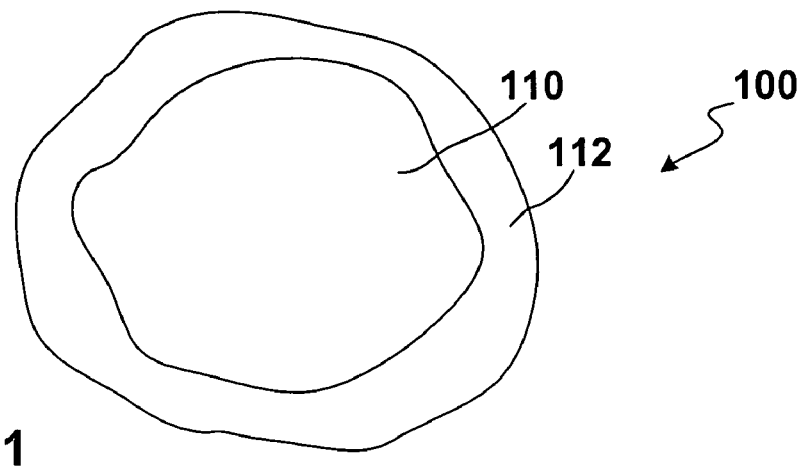
FIG. 1 is a computer image cross-section of a photomicrograph including a solder particle composition according to an embodiment.

FIG. 1 is a computer image cross-section of a photomicrograph including a metal particle composition 100 according to an embodiment. The metal particle composition 100 includes a total particle, size in a range of less than about 20 nanometer (nm). In an embodiment, the metal particle composition 100 includes a total particle size in a range from about 5 nm to 20 nm. In an embodiment, the metal particle composition 100 includes a total particle size in a range from greater than or equal to about 15 nm to about 20 nm. In an embodiment, the metal particle composition 100 includes a total particle size in a range of about 98% less than or equal to about 20 nm. In an embodiment, the metal particle composition 100 includes any metal particle or alloy particle that can be manufactured in these size ranges.

In an embodiment, the metal particle composition includes a melting temperature equal to or below about 400° C. Depending upon the metal type and the particle size, the metal particle composition can have a change in melting temperature of several hundred degrees. For example, gold indicates a melting temperature of about 1064° C. When gold is formed into a nano-sized particle as set forth herein, the melting temperature can be about 300° C.

In an embodiment, the metal particle composition includes a first metal 110 with a particle size in a range of less than or equal to about 20 nm, and the first metal 110 is present alone as a pure metal or as a macroscopically monophasic alloy. In an embodiment, the metal particle composition includes silver (Ag). In an embodiment, the metal particle composition includes copper (Cu). In an embodiment, the metal particle composition includes gold (Au). In an embodiment, the metal particle composition includes gold tin alloy (Au80Sn20). In an embodiment, the metal particle composition includes tin (Sn). In an embodiment, the metal particle composition includes a combination of at least two of the above metal particle compositions. In an embodiment, the metal particle composition includes a combination of at least three of the above metal particle compositions.

FIG. 1 illustrates another embodiment, such as the Au80Sn20 metal particle composition including the first metal 110 as a core structure that includes gold and a second metal 112 as a shell structure that includes tin. In an embodiment, the first metal 110 includes silver and the second metal 112 is selected from copper, gold, lead, and tin. In an embodiment, the first metal 110 includes gold and the second metal 112 is selected from copper, silver, lead, and tin. In an embodiment, the first metal 110 includes lead and the second metal 112 is selected from copper, silver, gold, and tin. In an embodiment, the first metal 110 includes tin and the second metal is selected from copper, silver, gold, and lead. In an embodiment, any of the above first metal 110, second metal 112 metal particle compositions include the first metal being present in a greater amount than the second metal.

In an embodiment, the first metal 110 has a first melting temperature, and the second metal 112 has a second melting temperature that is less than the first melting temperature. In this embodiment, the first metal 110 can be gold, and the second metal 112 can be tin.

Figure 2:
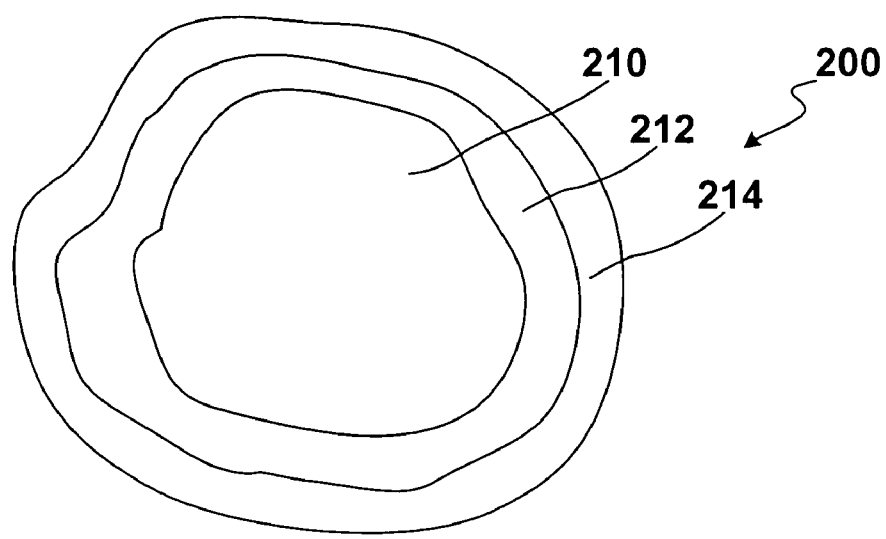
FIG. 2 is a computer image cross-section of a photomicrograph including a solder particle composition according to an embodiment.

FIG. 2 is a computer image cross-section of a photomicrograph 200 including a metal particle composition 200 according to an embodiment. In an embodiment, the metal particle composition 200 includes a first metal 210, a second metal inner shell 212, and third metal outer shell 214. In this embodiment, the first metal 210 is configured as a substantial core structure, the second metal 212 is configured as a substantial inner shell structure that is contiguous to the core structure 210, and the third metal 214 is configured as an outer shell structure 214 that is contiguous to the inner shell structure 212.

In an embodiment, the core 210 includes a first melting temperature, and the substantial outer shell 214 has a third melting temperature that is greater than the first melting temperature. In an embodiment, the core 210 has a first melting temperature, and the substantial outer shell 214 has a third melting temperature that is less than the first melting temperature. In this embodiment, the core 210 can be a first metal 210 such as gold, and the outer shell 214 can be a third metal 214 such as tin.

Figure 3:
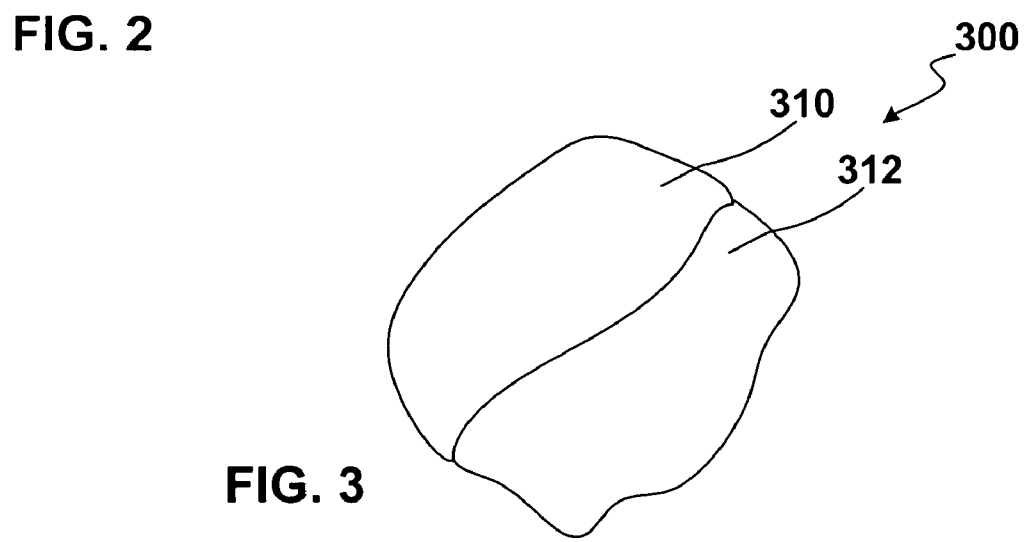
FIG. 3 is a computer image cross-section of a photomicrograph including a solder particle composition according to an embodiment.

FIG. 3 is a computer image cross-section of a photomicrograph 300 including a metal particle composition according to an embodiment. The metal particle composition 300 includes a first metal 310 that is substantially configured in a first part and a second metal 312 that is substantially configured in a second part. In an embodiment, the first part 310 is contiguous to the second part 312, but neither part substantially encompasses or is encompassed by the other part. In an embodiment, the first part 310 and second part 312 include a conglomerate and at least one of the first part 310 and the second part 312 have an aspect ratio in a range from about 0.5:1, including about 1:1, up to about 1:2. Accordingly, the minimum dimension of one of the first or second parts, 310, 312, can be as small as about 5 nm, and the maximuim dimension of one of the first or second parts, 310, 312, can be as large as 20 nm. In an embodiment, however, the effective minimum dimension of one of the first or second parts, 310, 312, can be as large 20 nm, and the maximuim dimension of one of the first or second parts, 310, 312, can be ascertained by selecting one of the aspect ratio embodiments set forth in this disclosure.

In an embodiment, any of the first metal and second metal particle compositions set forth in this disclosure can be used for the metal particle composition 300 depicted in FIG. 3.

Figure 4:
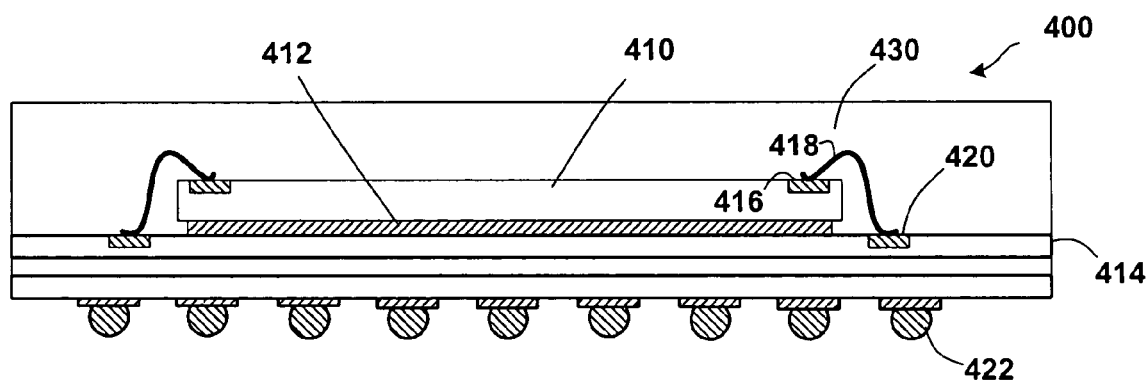
FIG. 4 is a cross-section elevation of a microelectronic device package according to an embodiment.

FIG. 4 is a cross-section of a package including a die-attach metal particle composition according to an embodiment. The package 400 includes a first die 410, and a die-attach metal particle composition 412 that adheres the first die 410 to a mounting substrate 414. In an embodiment, the metal particle composition 412 is any metal particle composition set forth in this disclosure.

The first die 410 is electrically coupled to the mounting substrate 414 through a die-bond pad 416, a bond wire 418, and a mounting substrate bond finger 420. Additionally, the package 400 may include further electrical connection such as a series of bumps, one of which is designated with reference numeral 422, for further mounting such as upon a motherboard.

In an embodiment, the mounting substrate 414 is part of a printed wiring board (PWB) such as a main board. In an embodiment, the mounting substrate 414 is part of an interposer. In an embodiment, the mounting substrate 414 is part of a mezzanine PWB. In an embodiment, the mounting substrate 414 is part of an expansion card PWB. In an embodiment, the mounting substrate 414 is part of a small PWB such as a board for a handheld device such as a cell phone or a personal digital assistant (PDA).

Figure 5A:
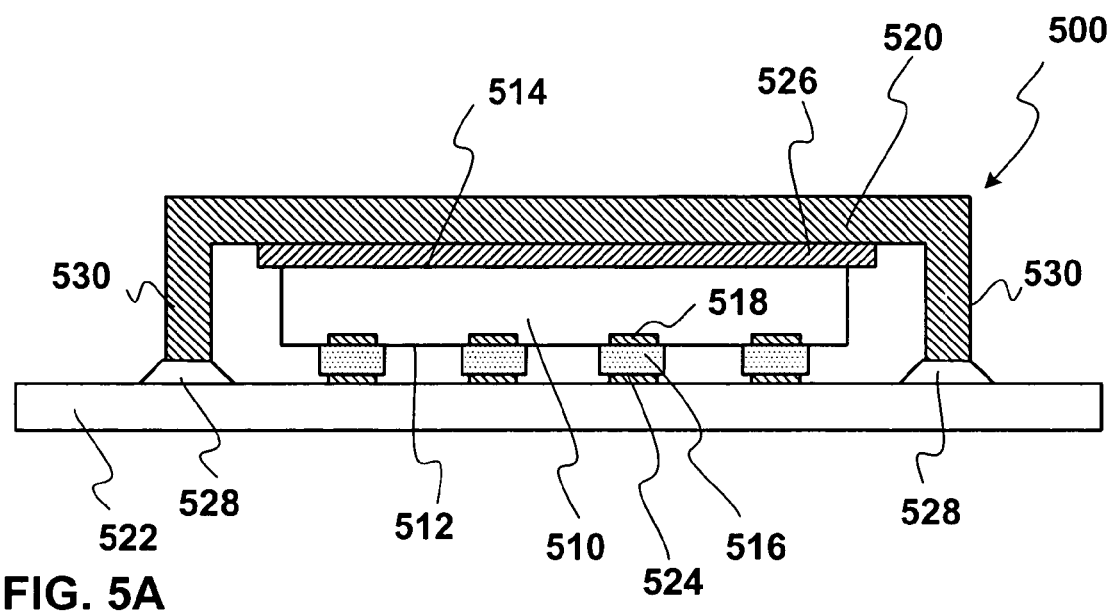
FIG. 5A is a cross section of a microelectronic device package according to an embodiment.

FIG. 5A is a cross section of a microelectronic device package 500 according to an embodiment. The microelectronic device package 500 includes a die 510 including an active surface 512 and a backside surface 514. In an embodiment, the die 510 is a processor such as a processor manufactured by Intel Corporation. In an embodiment, a fluxed solder particle composition paste 516 is provided on the active surface 512. A recessed bond pad 518 is disposed upon the active surface 512 and the recessed bond pad 518 makes contact with the fluxed solder particle composition paste 516. In an embodiment, the die 510 is disposed between an integrated heat spreader (IHS) 520 and a mounting substrate 522. The fluxed solder particle composition paste 516 is disposed on a mounting substrate bond pad 524. The fluxed solder particle composition paste 516 makes contact with the active surface 512 of the die 510. In an embodiment, the fluxed solder particle composition paste 516 is any metal particle composition set forth in this disclosure.

The mounting substrate 522 can be any mounting substrate known in the art, such as a printed circuit board (PCB), a main board, a motherboard, a mezzanine board, an expansion card, or another mounting substrate. In an embodiment, a thermal interface material (TIM) 526 is disposed between the backside surface 514 of the die 510 and the IHS 520. In an embodiment, the TIM 526 is a metal particle composition according to any of the embodiments set forth in this disclosure. In an embodiment, the TIM 526 is a solder. In an embodiment, the TIM 526 is a reactive metal particle composition that chemically bonds with the backside surface 514 during reflow processing. In an embodiment, the TIM 526 is a metal particle composition, such as a diamond-filled solder or a carbon fiber-filled solder. In an embodiment, the TIM is a reflowed metal particle composition including a grain size less than or equal to about 20 μm.

In an embodiment, the IHS 520 is attached with a bonding material 528 that secures a lip portion 530 of the IHS 520 thereto. Variations of the microelectronic device package 500 can be adapted to use of one of the several metal particle composition embodiments.

Figure 5B:
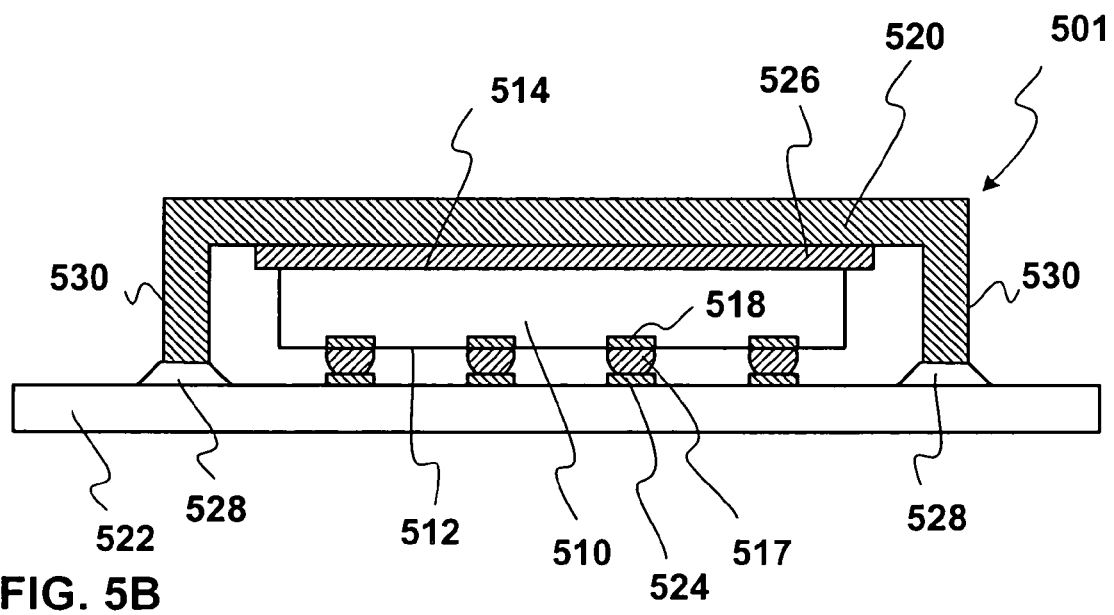
FIG. 5B is a cross section of the microelectronic device package depicted in FIG. 5A after further processing.

FIG. 5B is a cross section of the microelectronic device package 501 depicted in FIG. 5A after further processing. Reflow of the metal particle composition paste 516 (FIG. 5A) into a solder bump 517 and the metal particle composition TIM 526, or one of them in connection with the die 510, can be carried out by thermal processing. In an embodiment, heat is applied to achieve a temperature that approaches or achieves the solidus temperature of the specific solder bump 517 or of the TIM 526. In an embodiment, the solder bump 517 or the TIM 526 is depicted as having been heated to a range from about 150° C. to about 220° C. In an embodiment, the solder bump 517 or the TIM 526 is heated to a range from about 170° C. to about 200° C. In an embodiment, the solder bump 517 or the TIM 526 is heated to about 180° C. In an embodiment, the grain size on average in a range of less than or equal to about 20 μm.

Figure 6A:
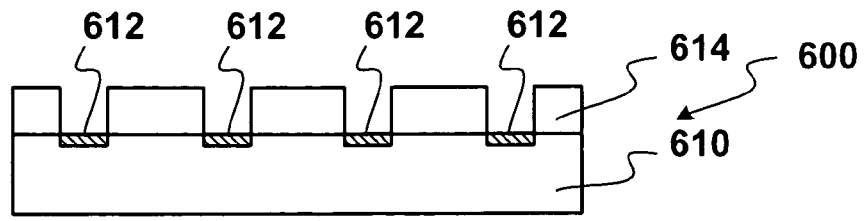
FIG. 6A is a cross section of a microelectronic device during processing according to an embodiment.

FIG. 6A is a cross section of a microelectronic device 600 during processing according to an embodiment. A substrate 610, such as a die that can be a processor, includes a bond pad 612 for electrical communication from the substrate 610 to the outside world. The microelectronic device 600 is depicted as being processed with a patterned mask 614 that exposes the bond pad 612. In an embodiment, the bond pad 612 is a copper upper metallization layer that can touch any one of several metallization layers. For example, a metallization layer such as metal one (M1, not pictured) in a simple microelectronic device makes electrical contact with the bond pad 612. In another example, a metallization layer such as metal two (M2, not pictured) makes electrical contact with the bond pad 612. The M2 makes electrical contact with the M1. In another example, a metallization layer such as metal three (M3, not pictured) makes electrical contact with the bond pad 612. The M3 makes electrical contact with the M2, which in turn makes electrical contact with the M1. In another example, a metallization layer such as metal four (M4, not pictured) makes electrical contact with the bond pad 612. The M4 makes electrical contact with the M3. The M3 makes electrical contact with the M2, which in turn makes electrical contact with the M1. In another example, a metallization layer such as metal five (M5, not pictured) makes electrical contact with the bond pad 612. The M5 makes electrical contact with the M4. The M4 makes electrical contact with the M3. The M3 makes electrical contact with the M2, which in turn makes electrical contact with the M1. In another example, a metallization layer such as metal six (M6, not pictured) makes electrical contact with the bond pad 612. The M6 makes electrical contact with the MS. The M5 makes electrical contact with the M4. The M4 makes electrical contact with the M3. The M3 makes electrical contact with the M2, which in turn makes electrical contact with the M1. In another example, a metallization layer such as metal seven (M7, not pictured) makes electrical contact with the bond pad 612. The M7 makes electrical contact with the M6. The M6 makes electrical contact with the M5. The M5 makes electrical contact with the M4. The M4 makes electrical contact with the M3. The M3 makes electrical contact with the M2, which in turn makes electrical contact with the M1. By this disclosure, it becomes clear that various semiconductor substrate structures are applicable to the various embodiments.

Figure 6B:
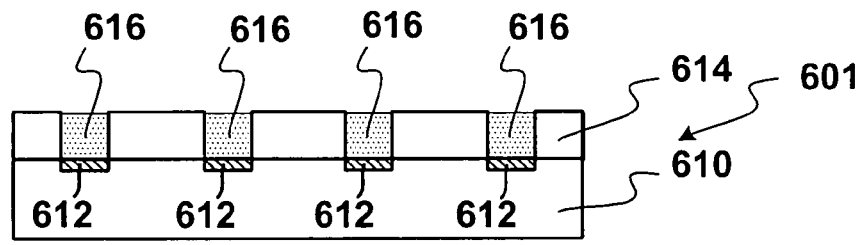
FIG. 6B is a cross section of the microelectronic device depicted in FIG. 6A after further processing.

FIG. 6B is a cross section of the microelectronic device 601 depicted in FIG. 6A after further processing. The patterned mask 614, which in an embodiment is a patterned photoresist, has been filled with a metal particle composition precursor 616 such as a fluxed metal particle composition powder 616, also referred to as a solder particle composition paste 616, according to the various embodiments set forth in this disclosure.

In an embodiment, the metal particle composition paste 616 includes the flux vehicle as the fugitive binder for the metal particle composition paste 616 during processing. In an embodiment, no patterning per se is done, rather, a fluxed metal particle composition is blanket formed, and, during reflow, the flux vehicle fluidizes and preferentially wets the bond pads 612, and preferentially becomes phobic of the substrate 610, which can be semiconductive, dielectric, and combinations thereof.

Figure 6C:
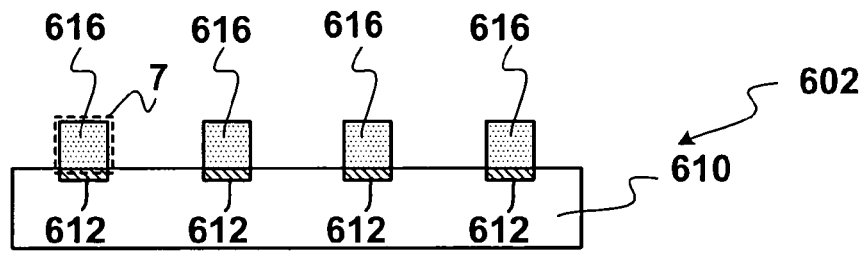
FIG. 6C is a cross section of the microelectronic device depicted in FIG. 6B after further processing.

FIG. 6C is a cross section of the microelectronic device 602 depicted in FIG. 6B after further processing. In this embodiment, the patterned mask 614 has been removed. Removal of the patterned mask 614 can be done by simply pulling it away from the substrate 610, and thereby leaving the fluxed metal particle composition 616 which is formed as discrete islands directly above the bond pads 612.

Figure 7:
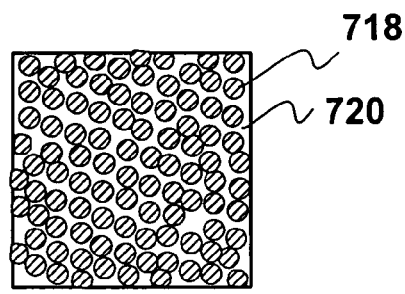
FIG. 7 is an enlargement of a portion of the microelectronic device depicted in FIG. 6C.

FIG. 7 is an enlargement of a portion of the microelectronic device depicted in FIG. 6C. FIG. 7 is taken from the area within the dashed line 7 depicted in FIG. 6C. FIG. 7 depicts a metal particle composition precursor as a metal particle composition 718 within a paste-and-flux matrix 720. The metal particle composition 718 includes one of the metal particle composition embodiments set forth in this disclosure. Because the paste-and-flux matrix 720 substantially protects the metal particle composition 718 from corrosive and/or oxidative influences, the metal particle composition 718 can resist substantial grain growth during reflow. In an embodiment, the metal particle composition 718 after reflow has a grain size in a range of less than or equal to about 20 micrometer (μm). Because of the particle size embodiments, nucleation of the particles to transition from solid to solidus can be initiated at about 400° or lower. For example, gold can experience a solid-to-solidus transition at about 300° C.

Figure 6D:
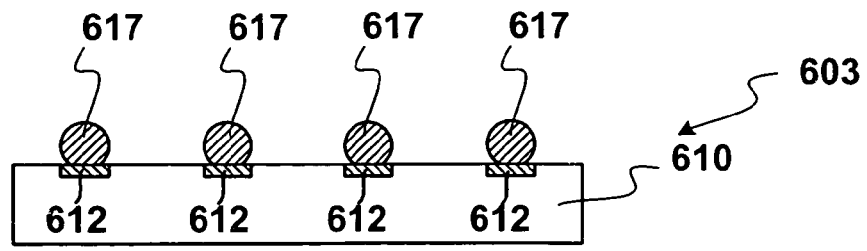
FIG. 6D is a cross section of the microelectronic device depicted in FIG. 6C after further processing.

FIG. 6D is a cross section of the microelectronic device 603 depicted in FIG. 6C after further processing. A reflow process has been commenced, during which the paste-and-flux matrix 720 (FIG. 7) has been volatilized, and the metal particle composition 718 has reflowed into a solder bump 617 (FIG. 6D) with a grain size in a range of less than or equal to about 20 μm. The reflow process depicted for the microelectronic device 603 can precede a method of assembling a microelectronic device package, it can be simultaneous with other heat treatments of a microelectronic device package, or it can follow some elements of assembling a microelectronic device package, including forming a metal particle composition die-attach embodiment. These and other embodiments are discussed subsequently.

Figure 8A:
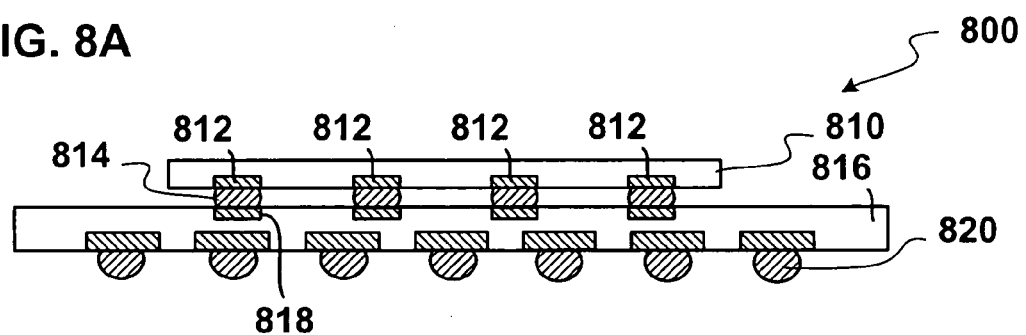
FIG. 8A is a cross section of a microelectronic device during processing according to an embodiment.

FIG. 8A is a cross section of a microelectronic device 800 during processing according to an embodiment. The device 800 includes a die 810 including a plurality of die bond pads 812. The device 800 also includes a metal particle composition 814 according to any of the metal particle composition embodiments set forth in this disclosure. The die 810 is coupled to a mounting substrate 816 through the metal particle composition 814, which acts as an electrical bump therebetween. Electrical coupling of the die 810 to the mounting substrate 816 is completed through a mounting substrate bond pad 818 that is aligned to the plurality of die bond pads 812. Further communication for the microelectronic device 800 is carried out by a plurality of board bumps, one of which is designated with the reference numeral 820.

Figure 8B:
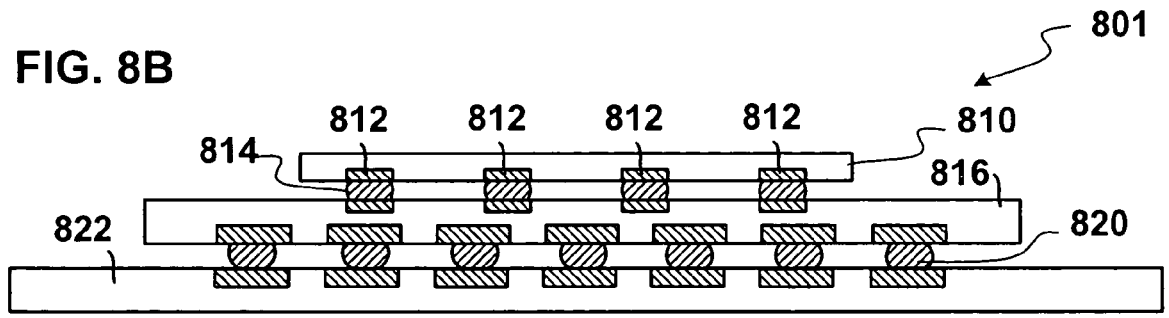
FIG. 8B is a cross section of the microelectronic device depicted in FIG. 8A after further processing.

FIG. 8B is a cross section of the microelectronic device 800 depicted in FIG. 8A after further processing. The microelectronic device 801 including the die 810 on the mounting substrate 816 has been mounted upon a board 822. In an embodiment, the board 822 has been bonded to the mounting substrate 816 through the board bump 820. In an embodiment, the board bump 820 includes any metal particle composition embodiment set forth in this disclosure.

The electrical bump embodiments set forth in this disclosure are also applicable to wire-bond technology. As the melting point initiates in the range of about 400° or lower, the process of wire bonding can be carried out under conditions to conserve the thermal budget of a wire-bond device.

Figure 9:
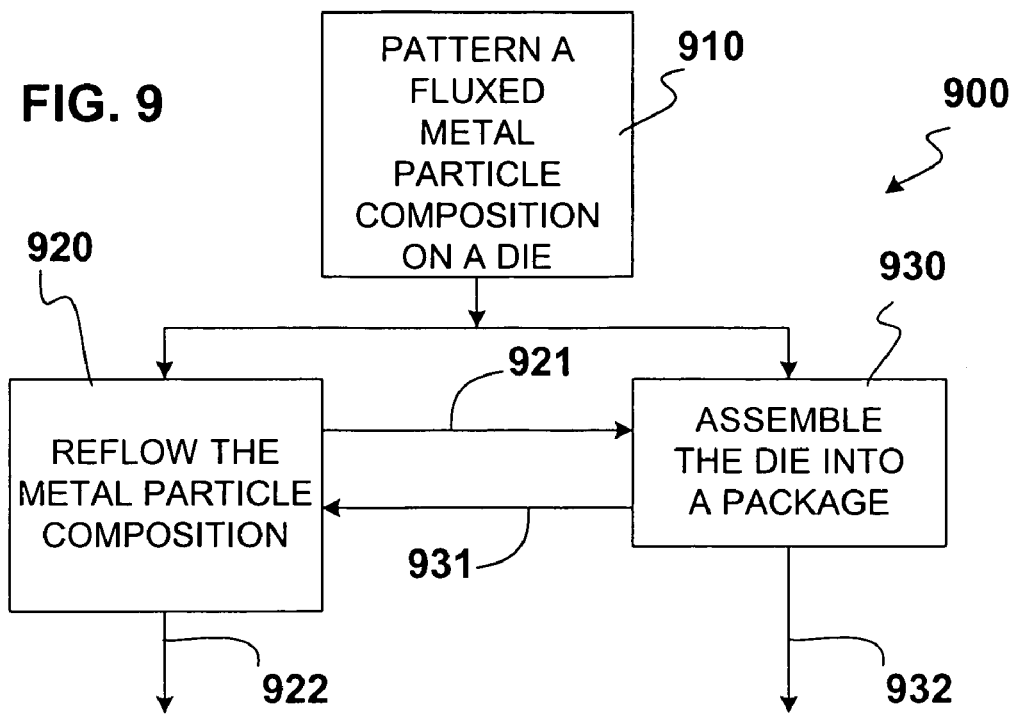
FIG. 9 is a process flow diagram according to various embodiments.

FIG. 9 is a process flow diagram 900 according to various embodiments. Processing of the fluxed metal particle composition is carried out during a process of forming a die attach and/or a solder bump, and during a method of assembling a packaged die, respectively. At 910, a fluxed metal particle composition embodiment is patterned on a die. By way of illustration in FIG. 4, a die-attach metal particle composition 412 is used to attach the die 410 to the mounting substrate 414. By way of further illustration in FIG. 6B, a patterned mask 614 has been filled with a fluxed metal particle composition 616.

At 920, the fluxed solder particle composition embodiment is reflowed on the die. By way of illustration in FIG. 5B, the reflowed, metal particle bumps 517 the reflowed TIM 526 are depicted as forming a metal compositions at significantly lower temperatures than the melting temperatures of the individual metals as a macroscopic bulk material. At 921, the process flow can proceed from the process of reflowing the fluxed metal particle composition to the method of assembling the die into a package. At 922, one process embodiment is completed.

Optionally in wire-bond technology, the process of patterning a fluxed metal particle composition powder on a die is carried out seriatim during the placing of wire-bond solder bumps onto a die.

At 930, the die including the solder or the fluxed metal particle composition is assembled into a package. By way of illustration, FIGS. 5A and 5B depict the assembly of a die 510 with at least a mounting substrate 522. In an embodiment, an IHS 520 or other heat sink substrate is also assembled with the fluxed metal particle composition 514 or the solder bump 517 and the die 510. At 931, the process flow can proceed from the method of assembling the die into a package, followed by the process of reflowing the metal particle composition into a die attach and/or into a solder bump. At 932, one method embodiment is completed.

Figure 10:
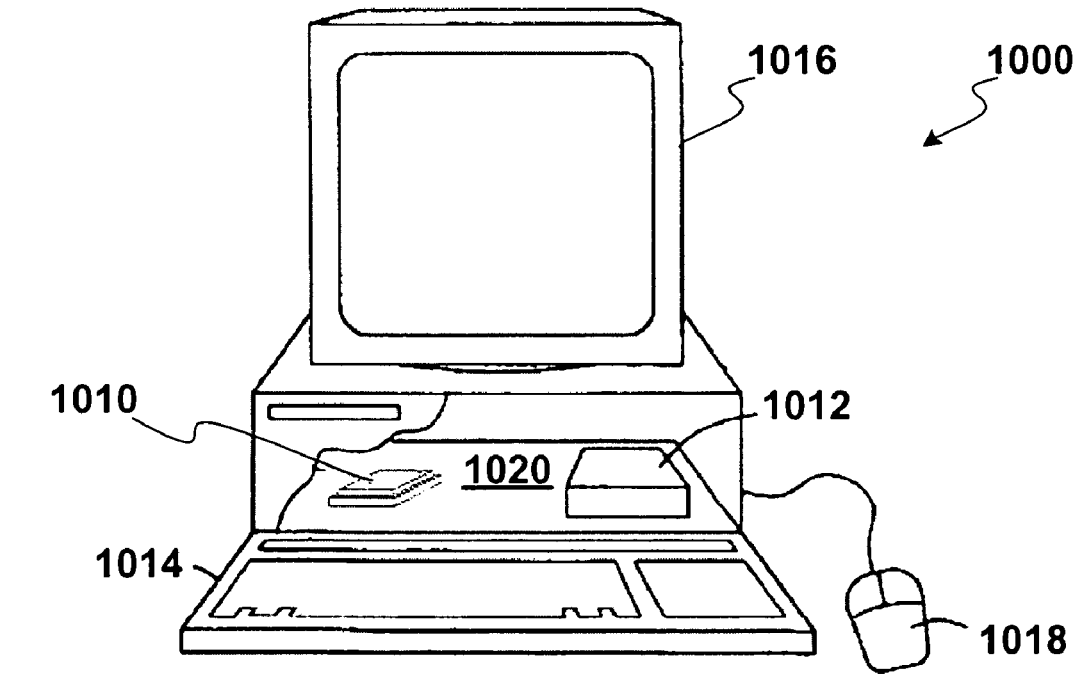
FIG. 10 is a depiction of a computing system according to an embodiment.

FIG. 10 is a cut-away elevation that depicts a computing system 1000 according to an embodiment. One or more of the foregoing embodiments of the metal particle composition, the die-attach composition, and/or the solder bump composition, may be utilized in a computing system, such as a computing system 1000 of FIG. 10. Hereinafter any embodiment alone or in combination with any other embodiment is referred to as a metal particle composition embodiment(s).

The computing system 1000 includes at least one processor (not pictured) that is enclosed in a package 1010, a data storage system 1012, at least one input device such as keyboard 1014, and at least one output device such as monitor 1016, for example. The computing system 1000 includes a processor that processes data signals, and may include, for example, a microprocessor, available from Intel Corporation. In addition to the keyboard 1014, the computing system 1000 can include another user input device such as a mouse 1018, for example. The computing system 1000 can correspond to any of the devices 400, 501, and 801, which include a die, a mounting substrate, and a board. Consequently the package 1010 (including a die) and the board 1020 are can correspond to these structures.

For purposes of this disclosure, a computing system 1000 embodying components in accordance with the claimed subject matter may include any system that utilizes a microelectronic device system, which may include, for example, at least one of the metal particle composition embodiment(s) that is coupled to data storage such as dynamic random access memory (DRAM), polymer memory, flash memory, and phase-change memory. In this embodiment, the metal particle composition embodiment(s) is coupled to any combination of these functionalities by being coupled to a processor. In an embodiment, however, a metal particle composition embodiment(s) set forth in this disclosure is coupled to any of these functionalities. For an example embodiment, data storage includes an embedded DRAM cache on a die. Additionally in an embodiment, the metal particle composition embodiment(s) that is coupled to the processor (not pictured) is part of the system with a metal particle composition embodiment(s) that is coupled to the data storage of the DRAM cache. Additionally in an embodiment, a metal particle composition embodiment(s) is coupled to the data storage 1012.

In an embodiment, the computing system can also include a die that contains a digital signal processor (DSP), a micro controller, an application specific integrated circuit (ASIC), or a microprocessor. In this embodiment, the metal particle composition embodiment(s) is coupled to any combination of these functionalities by being coupled to a processor. For an example embodiment, a DSP (not pictured) is part of a chipset that may include a stand-alone processor (in package 1010) and the DSP as separate parts of the chipset on the board 1020. In this embodiment, a metal particle composition embodiment(s) is coupled to the DSP, and a separate metal particle composition embodiment(s) may be present that is coupled to the processor in package 1010. Additionally in an embodiment, a metal particle composition embodiment(s) is coupled to a DSP that is mounted on the same board 1020 as the package 1010. It can now be appreciated that the metal particle composition embodiment(s) can be combined as set forth with respect to the computing system 1000, in combination with a metal particle composition embodiment(s) as set forth by the various embodiments of this disclosure and their equivalents.

Metal particle composition embodiments set forth in this disclosure can be applied to devices and apparatuses other than a traditional computer. For example, a die can be packaged with a metal particle composition embodiment(s), and placed in a portable device such as a wireless communicator or a hand-held device such as a personal data assistant and the like. Another example is a die that can be packaged with a metal particle composition embodiment(s) and placed in a vehicle such as an automobile, a locomotive, a watercraft, an aircraft, or a spacecraft.

The Abstract is provided to comply with 37 C.F.R. § 1.72 (b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A metal particle composition comprising:
a first metal core including a particle size in a range of less than or equal to about 20 nanometer (nm), wherein the first metal core is selected from copper, silver, gold, lead, and tin;
a second metal shell, wherein the second metal shell is selected from copper, silver, gold, lead, and tin, and wherein the metal particle composition includes a melting temperature equal to or below about 300° C.; and
a third metal shell, wherein the second metal shell is substantially configured in a inner shell, wherein the third metal shell is substantially configured in a outer shell, wherein the first metal includes a first melting temperature, wherein the third metal includes a third melting temperature, and wherein the first melting temperature is lower than the third melting temperature, and wherein the first metal core includes gold, wherein the second metal shell includes tin, and wherein the tin includes about 20% of the first metal core and the second metal shell.

2. A metal particle composition comprising:
a first metal core including a particle size in a range of less than or equal to about 20 nanometer (nm), wherein the first metal core is selected from copper, silver, gold, lead, and tin;
a second metal shell, wherein the second metal shell is selected from copper, silver, gold, lead, and tin, and wherein the metal particle composition includes a melting temperature equal to or below about 300° C.; and
a third metal shell, wherein the second metal shell is substantially configured in a inner shell, wherein the third metal shell is substantially configured in a outer shell, wherein the first metal includes a first melting temperature, wherein the third metal includes a third melting temperature, and wherein the first melting temperature is lower than the third melting temperature, and further including an organic matrix containing the metal particle composition as a plurality of particles.

3. A metal particle composition comprising:
a first metal core including a particle size in a range of less than or equal to about 20 nanometer (nm), wherein the first metal core is selected from copper, silver, gold, lead, and tin;
a second metal shell, wherein the second metal shell is selected from copper, silver, gold, lead, and tin, and wherein the metal particle composition includes a melting temperature equal to or below about 300° C.; and
a third metal shell, wherein the second metal shell is substantially configured in a inner shell, wherein the third metal shell is substantially configured in a outer shell, wherein the first metal includes a first melting temperature, wherein the third metal includes a third melting temperature, and wherein the first melting temperature is lower than the third melting temperature, and further including an organic matrix containing the metal particle composition as a plurality of particles, and wherein the organic matrix further includes a solder fluxing agent.

4. A metal particle composition comprising:
a first metal core including a particle size in a range of less than or equal to about 20 nanometer (nm), wherein the first metal core is selected from copper, silver, gold, lead, and tin;
a second metal shell, wherein the second metal shell is selected from copper, silver, gold, lead, and tin, and wherein the metal particle composition includes a melting temperature equal to or below about 300° C.; and
a third metal shell, wherein the second metal shell is substantially configured in a inner shell, wherein the third metal shell is substantially configured in a outer shell, wherein the first metal includes a first melting temperature, wherein the third metal includes a third melting temperature, and wherein the first melting temperature is lower than the third melting temperature, and wherein the first metal core includes a first melting temperature, wherein the second metal shell includes a second melting temperature, and wherein the first melting temperature is lower than the second melting temperature.

5. A metal particle composition comprising:
a first metal core including a particle size in a range of less than or equal to about 20 nanometer (nm), wherein the first metal core is selected from copper, silver, gold, lead, and tin;
a second metal shell, wherein the second metal shell is selected from copper, silver, gold, lead, and tin, and wherein the metal particle composition includes a melting temperature equal to or below about 300° C.; and
a third metal shell, wherein the second metal shell is substantially configured in a inner shell, wherein the third metal shell is substantially configured in a outer shell, wherein the first metal includes a first melting temperature, wherein the third metal includes a third melting temperature, and wherein the first melting temperature is lower than the third melting temperature, and wherein the first metal core includes a first melting temperature, wherein the second metal shell includes a second melting temperature, and wherein the second melting temperature is lower than the first melting temperature.

* * * * *